United States Patent
Xu et al.

(10) Patent No.: US 11,418,176 B2
(45) Date of Patent: Aug. 16, 2022

(54) MULTI-FREQUENCY UNIFORMIZATION CARRIER WAVE SLOPE RANDOM DISTRIBUTION PULSE WIDTH MODULATION METHOD

(71) Applicant: Naval University of Engineering, Wuhan (CN)

(72) Inventors: Jie Xu, Wuhan (CN); Ziling Nie, Wuhan (CN); Junjie Zhu, Wuhan (CN); Tinghao Wu, Wuhan (CN); Weiwei Ye, Wuhan (CN); Yi Han, Wuhan (CN); Xingfa Sun, Wuhan (CN); Wenkai Xu, Wuhan (CN); Jingxin Yuan, Wuhan (CN)

(73) Assignee: NAVAL UNIVERSITY OF ENGINEERING, Wuhan (CN)

( * ) Notice: Subject to any disclaimer, the term of this patent is extended or adjusted under 35 U.S.C. 154(b) by 0 days.

(21) Appl. No.: 17/313,038

(22) Filed: May 6, 2021

(65) Prior Publication Data
US 2021/0258000 A1    Aug. 19, 2021

Related U.S. Application Data

(63) Continuation-in-part of application No. PCT/CN2019/115284, filed on Nov. 4, 2019.

(30) Foreign Application Priority Data

Nov. 6, 2018  (CN) .......................... 201811312661.2

(51) Int. Cl.
*H03K 3/84*     (2006.01)
*H02M 7/5387*   (2007.01)

(52) U.S. Cl.
CPC ............ *H03K 3/84* (2013.01); *H02M 7/5387* (2013.01)

(58) Field of Classification Search
CPC . G06F 1/00; G06F 1/022; G06F 1/025; G06F 7/00; G06F 7/588; H02M 1/00;
(Continued)

(56) References Cited

U.S. PATENT DOCUMENTS 7,808,125 B1 * 10/2010 Sachdeva ................ H02M 7/49
                                                      307/82

* cited by examiner

*Primary Examiner* — Menatoallah Youssef
*Assistant Examiner* — Dave Mattison
(74) *Attorney, Agent, or Firm* — Matthias Scholl P.C.; Matthias Scholl

(57) ABSTRACT

A multi-frequency uniformization carrier wave slope random distribution pulse width modulation method, includes: (1) selecting a required random carrier wave sequence and a modulating wave, and after the two are compared, generating a switch device drive signal for pulse width modulation; (2) determining a multiple n of an equivalent carrier frequency f of the random carrier wave sequence, and selecting a main circuit topology; and (3) inputting the switch device drive signal generated in (1) into the main circuit topology of (2) to perform multi-frequency uniformization carrier wave slope random distribution pulse width modulation. The disclosure can improve a frequency domain distribution bandwidth of a harmonic wave without changing the mean and variance of a random carrier wave sequence, and realizes uniform distribution of carrier waves and multiple harmonic peaks near a doubled frequency of the carrier waves in a wider frequency domain.

5 Claims, 14 Drawing Sheets

(58) Field of Classification Search
CPC ............ H02M 1/08; H02M 1/12; H02M 7/00; H02M 7/483; H02M 7/5387; H03K 3/00; H03K 3/84; H03K 5/00; H03K 5/132
USPC ........................................................ 327/164
See application file for complete search history.

(a) Line voltage and its FFT of the fixed carrier wave phase shifting pulse width modulation (b) Line voltage and its FFT of the multi-frequency uniformization carrier wave phase shifting pulse width modulation

MULTI-FREQUENCY UNIFORMIZATION CARRIER WAVE SLOPE RANDOM DISTRIBUTION PULSE WIDTH MODULATION METHOD

CROSS-REFERENCE TO RELATED APPLICATIONS

This application is a continuation-in-part of International Patent Application No. PCT/CN2019/115284 with an international filing date of Nov. 4, 2019, designating the United States, now pending, and further claims foreign priority benefits to Chinese Patent Application No. 201811312661.2 filed Nov. 6, 2018. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure relates to the field of power electronic technology, and more specifically to a multi-frequency uniformization carrier wave slope random distribution pulse width modulation method.

In power electronic technology, pulse width modulation technology with a fixed switching frequency has been widely used, but the output harmonic waves of the pulse width modulation technology have a large number of peaks near the switching frequency and multiples of the switching frequency. The harmonic waves are the main cause of noise and mechanical vibration.

To achieve electromagnetic interference suppression, vibration damping and noise reduction, investigators generally add filters, and vibration damping and noise reduction equipment. These methods have obvious disadvantages, such as high cost, complex harmonic detection and compensation caused by active filters; slow dynamic response, and poor filtering effect on fast-changing processes caused by passive filters; too much occupying space and overall weight increase caused by additional filters and vibration reduction equipment, resulting in that these methods are not desirable solutions for many devices with limited space and load.

In general, the existing random pulse width modulation technology selects different "random functions" based on the model proposed by A. M. Trzynadlowski to obtain harmonic waves more uniformly distributed in the frequency domain. However, no matter how random modulation strategies are changed, it is difficult to reduce prominent maximum single harmonic peak near the carrier frequency, and it is unable to change the current situation where the harmonic waves near the carrier frequency have the densest spectral lines and more prominent amplitudes.

SUMMARY

An object of the disclosure is to provide a multi-frequency uniformization carrier wave slope random distribution pulse width modulation method aiming at problems of prominent maximum single harmonic spectral amplitudes and densely distributed harmonic spectral lines of output harmonic waves near low-times carrier frequencies based on random pulse width modulation technology. The method combines the principle of "equivalent carrier frequency doubling" in carrier wave phase-shifting pulse width modulation with the carrier wave slope random distribution pulse width modulation technology, thus can greatly improve a frequency domain distribution bandwidth of a harmonic wave without changing the mean and variance of a random carrier wave sequence, and realizes uniform distribution of carrier waves and multiple harmonic peaks near a doubled frequency of the carrier waves in a wider frequency domain.

To achieve the above object, a multi-frequency uniformization carrier wave slope random distribution pulse width modulation method is provided in the disclosure, and what is special about the method is that the multi-frequency uniformization carrier wave slope random distribution pulse width modulation method is used to make equivalent bandwidths of harmonic waves centered on various-times carrier frequencies and symmetrically distributed increase to enlarge the range of uniform distribution of the harmonic waves in frequency domain. The method comprises:

(1) selecting a required random carrier wave sequence and a modulating wave, and after the two are compared, generating a switch device drive signal for pulse width modulation;

(2) determining a multiple n of an equivalent carrier frequency f of the random carrier wave sequence, and selecting a matched main circuit topology for carrier wave phase-shifting pulse width modulation; and (3) inputting the switch device drive signal generated in (1) into the main circuit topology in (2) to perform multi-frequency uniformization carrier wave slope random distribution pulse width modulation In an embodiment of the disclosure, the probability statistical parameter of the random carrier wave sequence is set in advance, and the average carrier frequency of the random carrier wave sequence is $f_{av}$, the variance of a corresponding random carrier period is $T_o^2$, and the repetition time of the random carrier wave sequence is T, so as to control the frequency domain distribution of output voltage harmonic waves.

In another embodiment of the disclosure, the average carrier frequency $f_{av}$ of the random carrier wave sequence is equal to the frequency of the modulating wave, so as to ensure equal switching times within the same time, that is, the switching loss remains unchanged.

In still another embodiment of the disclosure, the multiple n of the equivalent carrier frequency f is equal to 4, and the main circuit topology employs an inverter module with double H-bridges cascaded. In a further another embodiment of the disclosure, the multiple n of the equivalent carrier frequency f is equal to 6, and the main circuit topology employs an inverter module with three H-bridges cascaded.

The following advantages are associated with the multi-frequency uniformization carrier wave slope random distribution pulse width modulation method of the disclosure:

1) compared with the random pulse width modulation method, the multi-frequency uniformization carrier wave slope random distribution pulse width modulation method can greatly expand the distribution range of harmonic spectral lines and reduce maximum single harmonic peaks without changing the mean and variance of a random carrier wave sequence;

2) compared with the random pulse width modulation method, the multi-frequency uniformization carrier wave slope random distribution pulse width modulation method can make the harmonic spectrum distributed in a wider frequency domain, and bring the harmonic spectral line close to white noise;

3) the multi-frequency uniformization carrier wave slope random distribution pulse width modulation method can decrease the electromagnetic interference inside the power system and reduce mechanical vibration and noise from the source without changing the main circuit topology for pulse width modulation, and provide a new way to effectively solve a problem of electromagnetic interference inside the power system and problems of the vibration and the noise outside the system; vibration damping and noise reduction do not rely on additional equipment, thus reducing the cost of filtering and vibration reduction, and saving system resources.

DETAILED DESCRIPTIONS

The disclosure will be further described in detail below with reference to the drawings and specific embodiments.

The present multi-frequency uniformization carrier wave slope random distribution pulse width modulation method equivalently increases carrier frequencies by carrier phase-shifting pulse width modulation while combining carrier wave slope random distribution pulse width modulation technology to disperse carrier waves and the harmonic peaks near a doubled frequency of the carrier waves, that is: the multi-frequency uniformization carrier wave slope random distribution pulse width modulation method is used to make equivalent bandwidths of harmonic waves centered on various-times carrier frequencies and symmetrically distributed increase to enlarge the range of uniform distribution of the harmonic waves in frequency domain.

The multi-frequency uniformization carrier wave slope random distribution pulse width modulation method specifically comprises the following steps:

(1) selecting a required random carrier wave sequence and a modulating wave, and after the two are compared, generating a switch device drive signal for pulse width modulation.

The probability statistical parameter of the random carrier wave sequence is set in advance, that is, the average carrier frequency of the random carrier wave sequence is $f_{av}$, the variance of a corresponding random carrier period is $T_o^2$, and the repetition time of the random carrier wave sequence is T, so as to control the frequency domain distribution of output voltage harmonic waves. The average carrier frequency $f_{av}$ of the random carrier wave sequence is equal to the frequency of fixed carrier waves to be modulated, so as to ensure equal switching times within the same time is, that is, the switching loss remains unchanged.

(2) determining a multiple n of an equivalent carrier frequency f, and selecting a matched main circuit topology for carrier wave phase-shifting pulse width modulation; and (3) inputting the switch device drive signal generated in (1) into the main circuit topology of (2) to perform multi-frequency uniformization carrier wave slope random distribution pulse width modulation.

Figure 1:
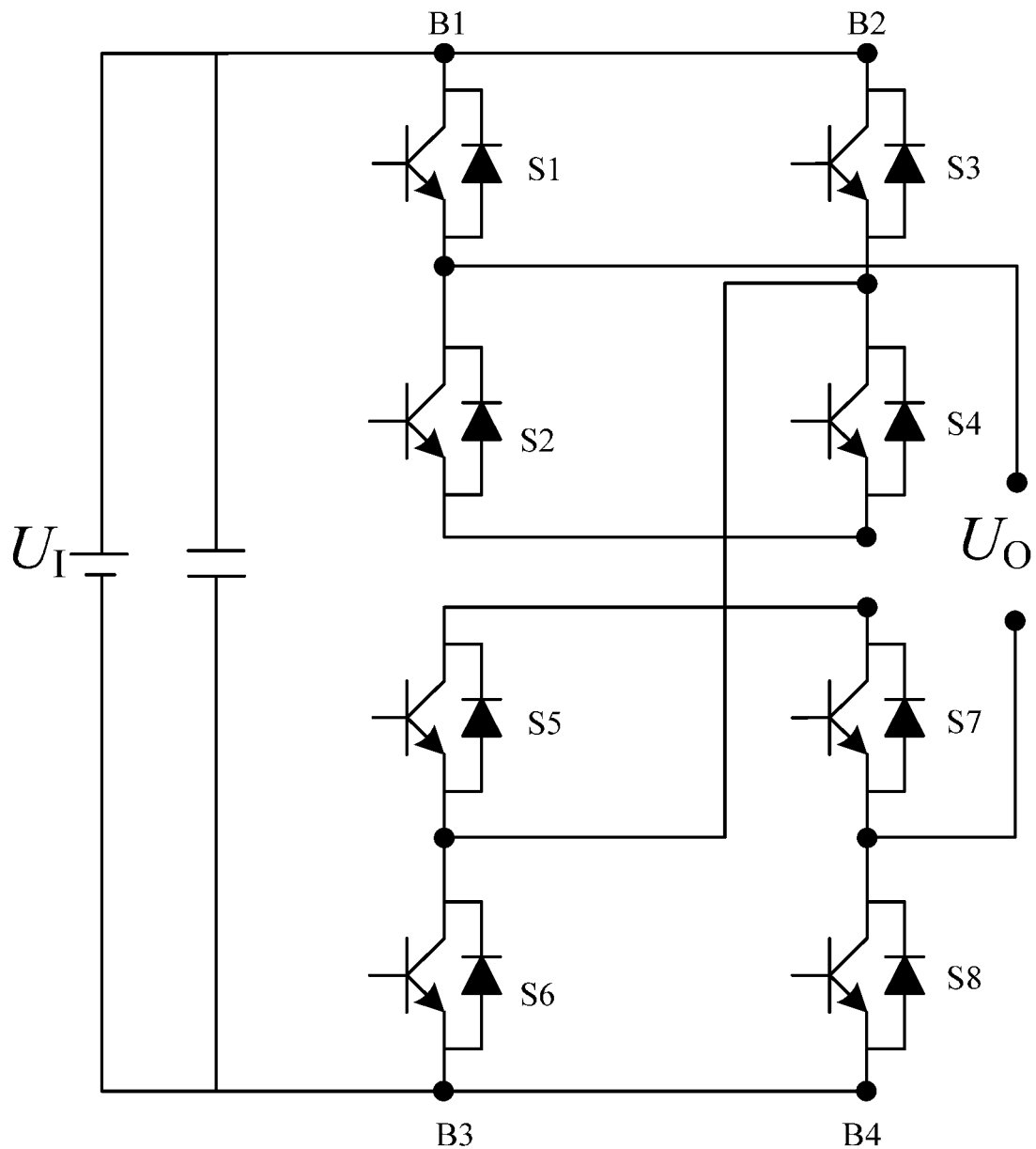
FIG. 1 is a topological diagram of a main circuit with double H-bridges cascaded.

For example, select a random carrier wave sequence S that obeys uniform distribution, the average carrier frequency of the random carrier wave sequence is $f_{av}$, the modulating wave frequency is $f_o$, and the multiple n of equivalent carrier frequency is equal to 4. As shown in FIG. 1, select an inverter module with two H-bridges cascaded, labels $S_1$ to $S_8$ represent switch devices, label $U_1$ and label $C_1$ respectively represent DC (Direct Current) side voltage and support capacitor, and labels $B_1$, $B_2$, $B_3$ and $B_4$ respectively represent the left leg and the right leg of the upper H bridge and the left leg and the right leg of the lower H bridge. Labels $U_{B1}$ and $U_{B2}$ respectively represent the mid-point voltages of the leg $B_1$ and the leg $B_2$ of the upper H bridge, labels $U_{B3}$ and $U_{B4}$ respectively represent the mid-point voltages of the leg $B_3$ and the leg $B_4$ of the lower H bridge. Interleaved control technology (that is, carrier phase-shifting control) is used between the H-bridge inverter, thus to achieve the effect of working on quadruple frequency. The four sets of random carrier wave sequences are staggered by a certain phase, and accordingly the four random carrier wave sequences with different phases are respectively compared with the modulating wave to generate four sets of pulse width modulation signals $U_{B1}$~$U_{B4}$ that are relatively independent. For driving power units, the output of each power unit is superimposed together, thus obtaining a five-level output phase voltage $U_O$, at this time the equivalent average carrier frequency is $4f_{av}$.

Figure 2:
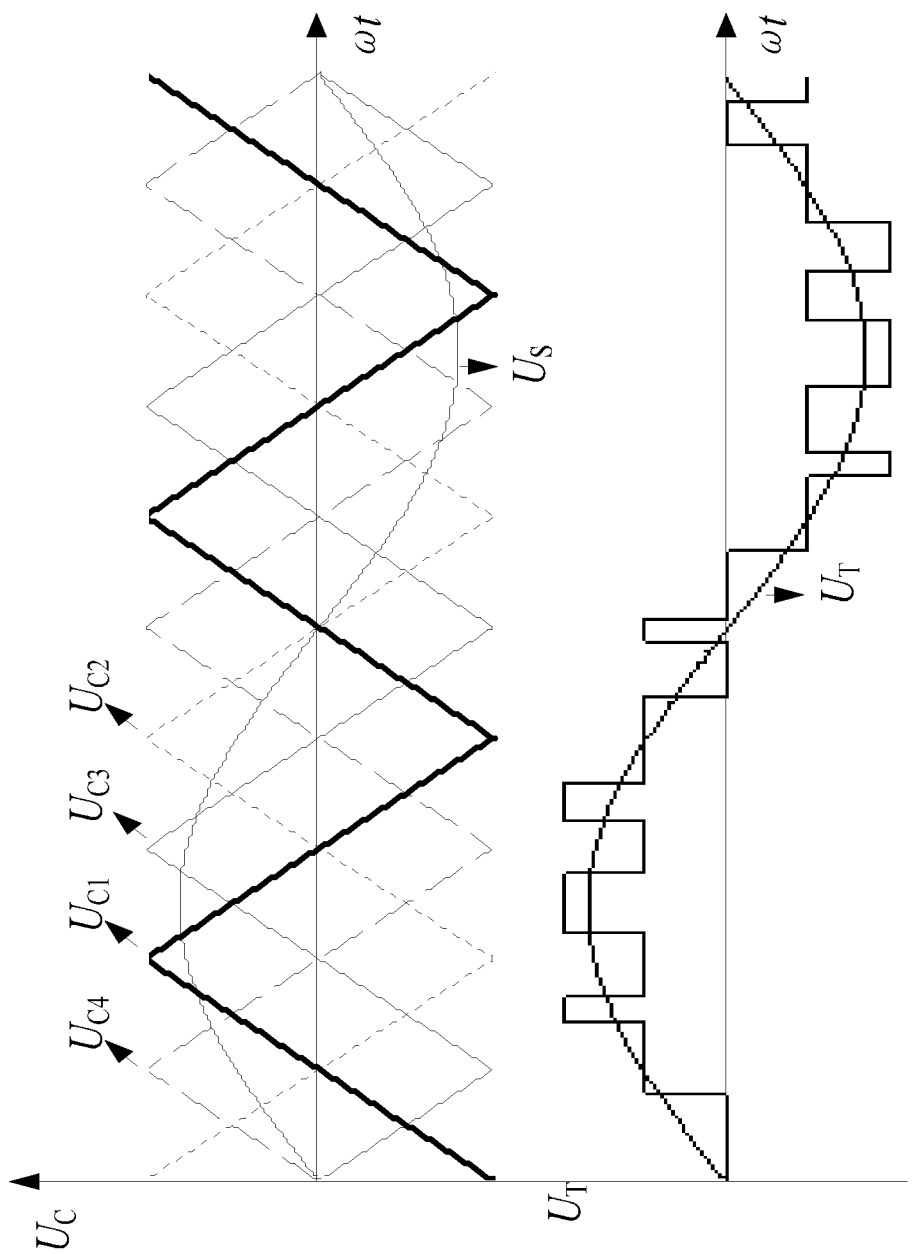
FIG. 2 is a schematic diagram of five-level carrier phase-shifting pulse width modulation.

FIG. 2 is a principle diagram of five-level carrier phase-shifting PWM (Pulse Width Modulation) method. In FIG. 2, labels $U_{C1}$, $U_{C2}$, $U_{C3}$, and $U_{C4}$ respectively represent the carrier waves of the legs $B_1$, $B_2$, $B_3$, and $B_4$, and labels Us represents a modulating wave. For a five-level converter, four triangular carrier waves that are offset by 90° from each other are respectively compared with the modulating wave to generate four sets of PWM modulation signals that are relatively independent with each two mutually inverted. The four sets of PWM modulation signals drive eight power units. Each H-bridge unit degrades into two-level PWM control, the output of the upper and lower H bridges is added together to generate an equivalent five-level pulse width modulating waveform.

When the multiple n of the equivalent carrier frequency f is set to be equal to 6, then the main circuit topology could employ an inverter module with three H-bridges cascaded, and the principle is the same as the principle in case of the multiple n equal to 4, and thus will not be repeated in detail here.

The course of the study of the disclosure is as follows:

Carrier wave slope random distribution pulse width modulation technology

Random carrier waves are introduced on the basis of fixed carrier wave pulse width modulation, so output voltage harmonic waves of the carrier wave slope random distribution pulse width modulation technology can be expressed by the following formula:

$$U_o = r - \sum_{i=1}^{\infty}\sum_{n=1}^{\infty} \left(\frac{4}{n\pi}\right)\cos\left[\frac{n\pi}{2} + \frac{(n-1)\pi}{2}\right]\cos(2n\pi f_i t) = \quad (1)$$

$$r - \sum_{i=1}^{\infty}\sum_{n=1}^{\infty} \left(\frac{4}{n\pi}\right)\cos\left[\frac{n\pi}{2} + \frac{(n-1)\pi}{2}\right]\cos(2n\pi f_{av} t + \phi_i)$$

It can be seen that the output voltage harmonic waves for the carrier wave slope random distribution pulse width modulation contains multiple random carrier waves, so the regularity expanded by the harmonic waves is no longer a single carrier frequency. The random carrier part after Fourier transformed can be expressed by formula (2):

$$F\left[\sum_{i=1}^{\infty}\cos(n\omega_i t)\right] = \pi\sum_{i=1}^{\infty}[\delta(\omega + \omega_i) + \delta(\omega - \omega_i)] \quad (2)$$

Figure 3:
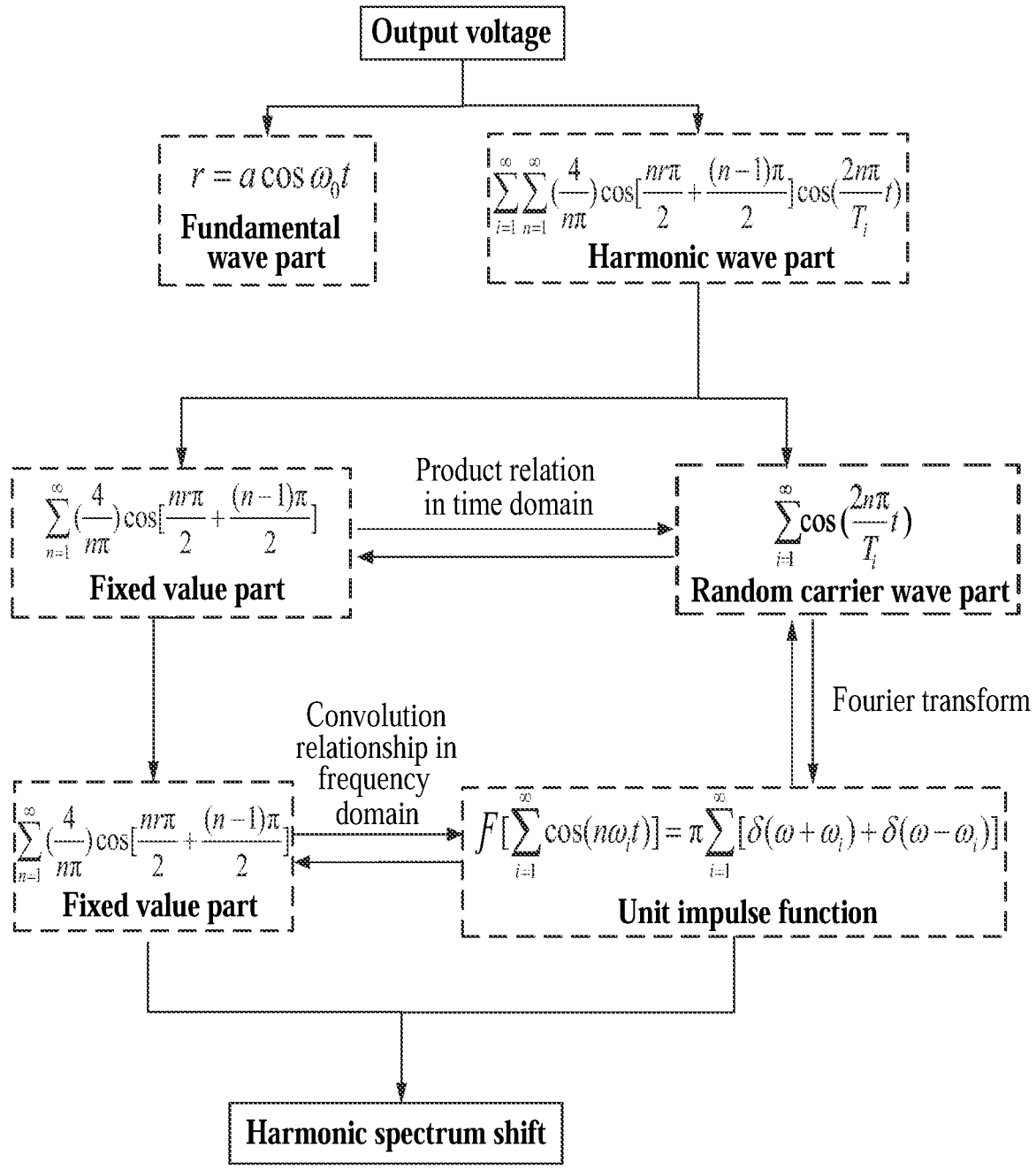
FIG. 3 is the basic principle diagram of harmonic frequency shift.

This process is shown in FIG. 3.

From FIG. 3 and formula (2), it can be seen that the frequency point shifted in the harmonic frequency domain is determined by multiple random carrier waves. If the pulse number of random pulse width modulation remains equal to the pulse number of the fixed carrier frequency pulse width modulation within the same time, and the carrier waves are changed randomly, it can ensure that the distribution regulation of the harmonic waves in the frequency domain is changed while the switching loss remains the same. That is to say, all the signal harmonic waves that can be expanded by Fourier series will be dispersed in the frequency domain under the regulation of different carrier frequency. The spectral lines of the harmonic waves in the frequency domain are no longer concentrated only near a fixed carrier frequency and a doubled frequency of the carrier waves, and then achieve the purpose of enlarging the distribution range of the harmonic spectrum and dispersing the harmonic energy.

In the previous research (a low electromagnetic interference carrier wave slope random distribution pulse width modulation technology, Proceedings of the CSEE (Chinese Society for Electrical Engineering), 2017, 37(14): 4175-4183), the distribution range of the output voltage harmonic waves is proportional to the variance and the third power of the average carrier frequency of the random carrier wave sequence:

$$b \propto T_o^2 \quad (3)$$

$$b \propto f_{av}^3 \quad (4)$$

In the above formulas, b is the 3 dB bandwidth of the harmonic wave, $f_{av}$ is the average of the frequencies of the random carrier wave sequence, and $T_o^2$ is the variance of the period of the random carrier wave sequence.

In the engineering application of the random pulse width modulation technology, the average carrier frequency of the random carrier wave sequence generally remains the same as the carrier frequency for the fixed carrier wave pulse width modulation to ensure the same switching loss during the same repetition modulating time T. Considering formula (3) and formula (4) together, to improve the bandwidth corresponding to various-times carrier frequencies and increase the dispersion level of the harmonic waves in the frequency domain, the variance of the period of the random carrier wave sequence requires changing, but changing the variance of the period of the random carrier wave sequence needs to involve the change of many probability statistical parameters of the random carrier wave sequence, and there are many variables that need to be considered.

Figure 4:
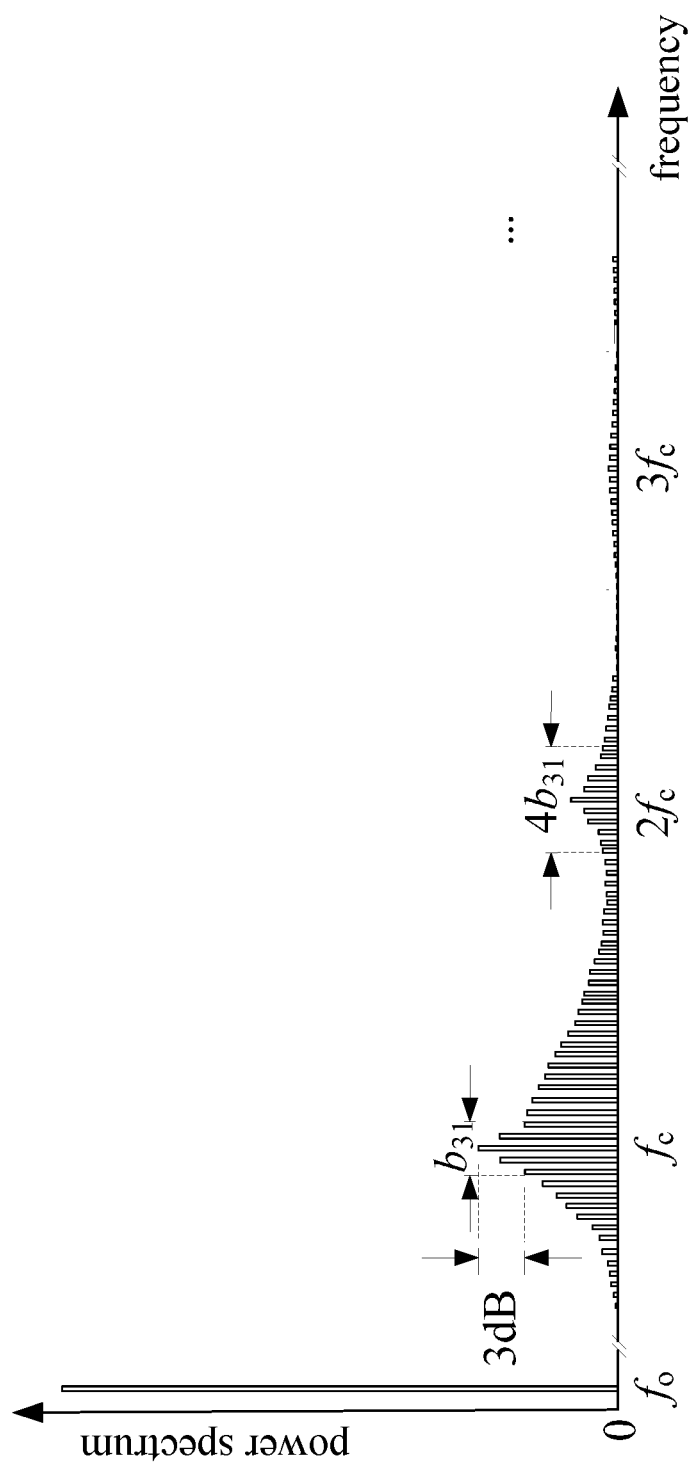
FIG. 4 is a schematic diagram of the harmonic power spectrum based on carrier wave slope random distribution pulse width modulation technology.

According to the aforementioned researches and the formulas (3) and (4), a schematic diagram of the output voltage power spectrum based on the carrier wave slope random distribution pulse width modulation technology is obtained as shown in FIG. 4

In carrier wave slope random distribution pulse width modulation technology as shown in FIG. 4, the distribution range of the various-times harmonic spectral line is symmetrically dispersed with the carrier frequency and doubled frequency of the carrier waves as the center, and the harmonic dispersion range of various-times carrier waves according to formula (1) is $2f_i$, but the 3 dB bandwidth corresponding to the high-times carrier frequency is higher than that corresponding to the low-times carrier waves. That is, the high-frequency band harmonic waves will spread to the low-frequency band, causing the low-frequency band spectral lines to alias and the amplitude to increase, and because the 3 dB bandwidth corresponding to one time the carrier frequency is relatively low, and the harmonic amplitude near one time the carrier frequency is the highest, there is still an obvious harmonic concentration part near one time the carrier frequency after the carrier wave slope random distribution pulse width modulation is performed.

Figure 5A:
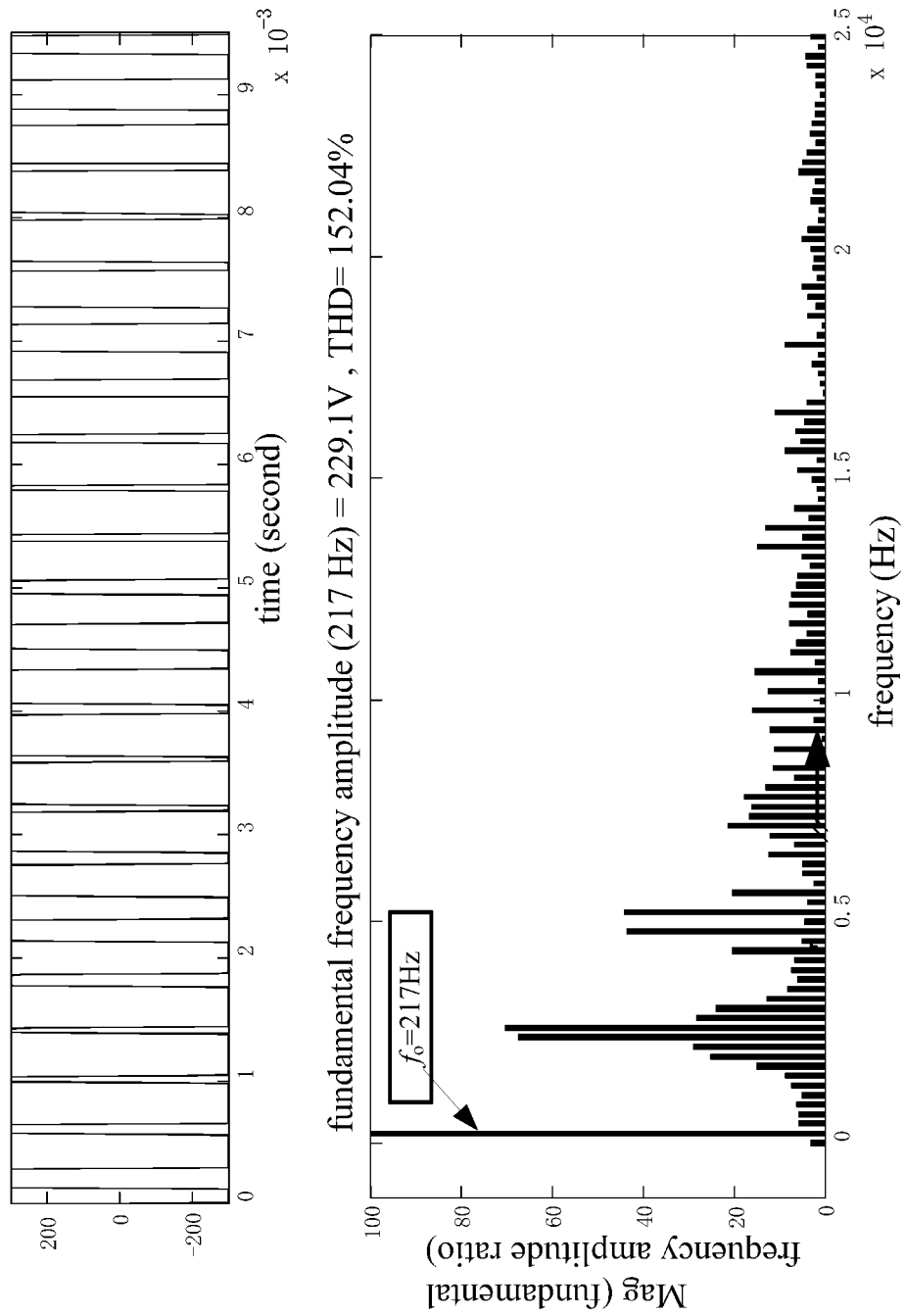
FIGS. 5A and 5B are schematic diagrams of FFT analyses of output voltages using two kinds of pulse width modulation.
Figure 5B:
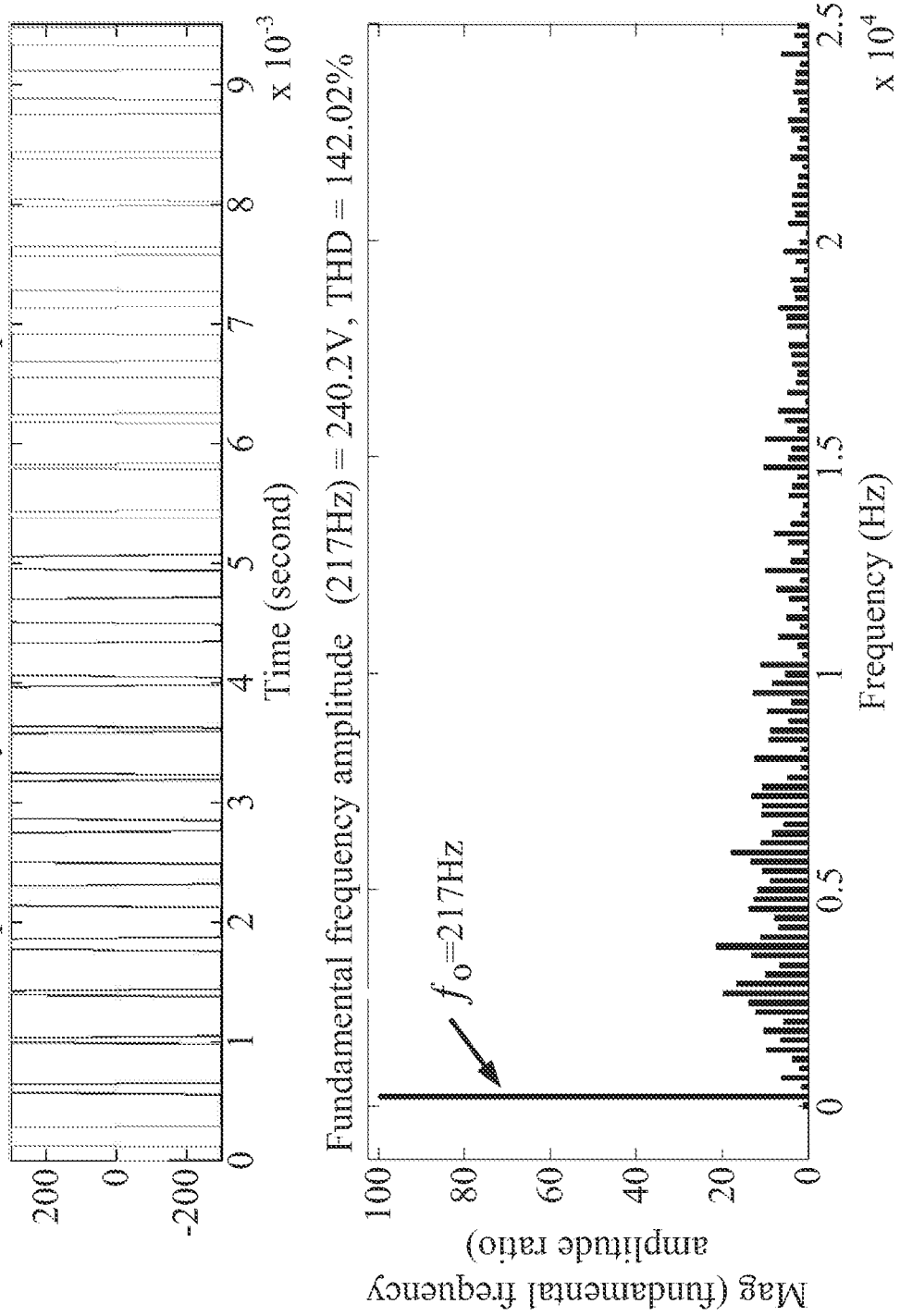

The frequency domain distribution of harmonic waves is similar to the power spectrum, but the distribution information of the spectral lines is more detailed. In the previous researches, the DC (Direct Current) input voltage of the inverter during simulation was set to 100 V, and a load with a resistance of 10Ω was connected. The modulated signal was a sine wave with a frequency $f_o$ set to 217 Hz. When a fixed carrier wave pulse width modulation was performed, the carrier frequency was 2.5 kHz; but when the carrier wave slope random distribution pulse width modulation, a random carrier wave sequence containing 200 random carrier waves with a mean of 2.5 kHz and a variance of $1.81 \times 10^{-8}$ was added in a repetition time of 0.02 seconds to obtain time and frequency domain distribution of the output voltage harmonic waves shown in FIGS. 5A-5B.

Carrier Wave Phase-Shifting Pulse Width Modulation Technology

Figure 6:
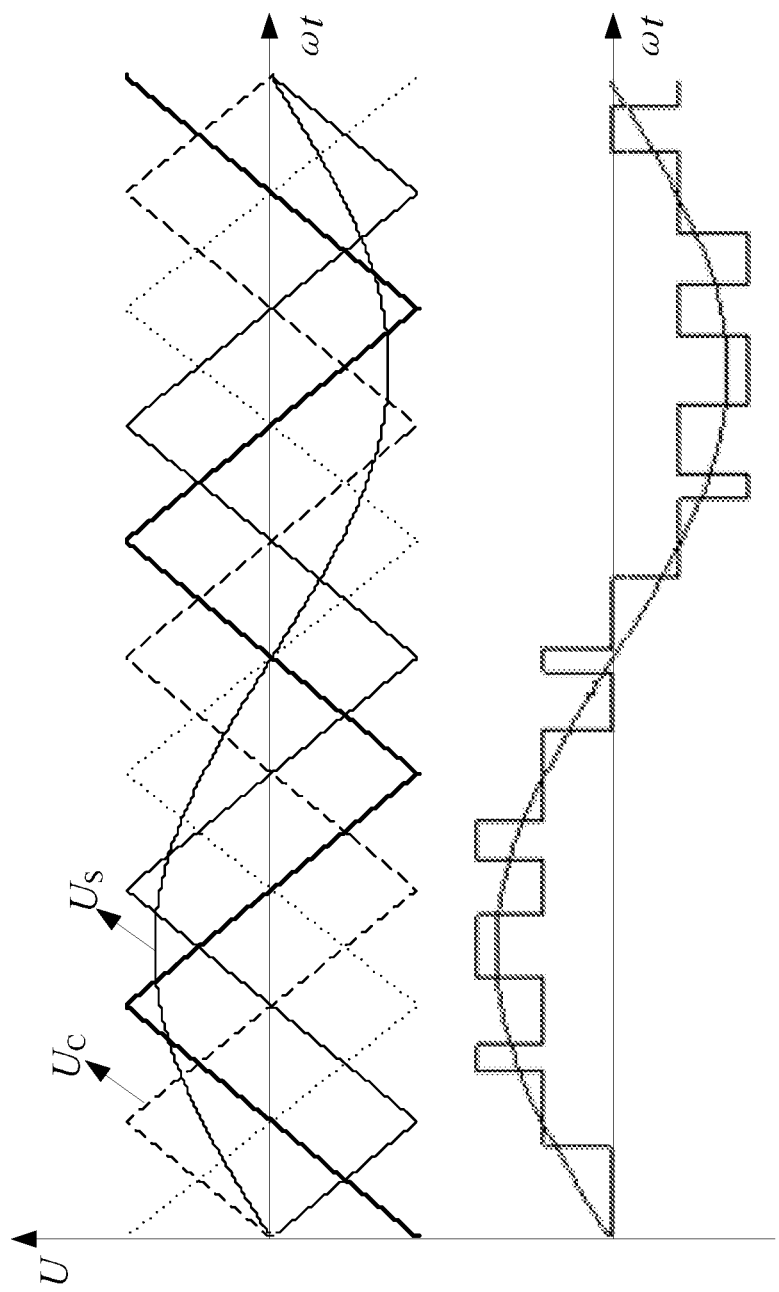
FIG. 6 is a schematic diagram of carrier phase-shifting pulse width modulation.

As shown in FIG. 6, the carrier wave phase-shifting pulse width modulation technology generates a required switch device drive signal by comparing multiple triangular carrier waves being phase shifted with the modulating wave.

For n cascaded two-level H bridges, the phase angles of the triangular carrier waves are staggered sequentially by $\pi/n$, the initial phase of the first carrier wave is $\theta_c$, and the output voltage of the k-th H bridge can be expressed by formula (5):

$$U_o(t)_{(k)} = U\left\{m\sin(\omega_s t + \theta_s) + \frac{4}{\pi}\sum_{a=1}^{\infty}\sum_{b=-\infty}^{\infty}\frac{1}{a}\sin(a+b)\frac{\pi}{2}J_b\left(a\frac{\pi}{2}M\right)\right.$$

$$\left.\sin\left[a\left(\omega_c t + \theta_c + (k-1)\frac{2\pi}{n}\right) + b(\omega_s t + \theta_s)\right]\right\} \quad (5)$$

In the above formula, k=1, 2, ..., n, U is the DC input voltage of the H-bridge, m is the amplitude modulation ratio, $\omega_s$ is the angular frequency of the modulating wave, coy is the angular frequency of the triangular carrier wave, and J(x) is Bessel function.

According to the basic properties of trigonometric functions, the second term in formula (5) can obtain the following relationship:

$$\frac{4}{\pi}\sum_{k=1}^{n}\sin\left[a\left(\omega_c t + \theta_c + (k-1)\frac{2\pi}{n}\right) + b(\omega_s t + \theta_s)\right] = \begin{cases} 0 & a \neq kn \\ n\sin[a(\omega_c t + \theta_c + b(\omega_s t + \theta_s)] & a = kn \end{cases} \quad (6)$$

In the above formula, k=1, 2, ..., ∞. According to the formula (6), the output voltage can be expressed as:

$$U_o(t)_{(k)} = U\{m\sin(\omega_s t + \theta_s) + \frac{4}{\pi}\sum_{a=1}^{\infty}\sum_{b=-\infty}^{\infty}\frac{1}{kn}\sin(kn+b) \quad (7)$$
$$\frac{\pi}{2}J_b\left(kn\frac{\pi}{2}M\right)\sin[kn(\omega_c t + \theta_c + b(\omega_s t + \theta_s)]\}$$

Figure 7:
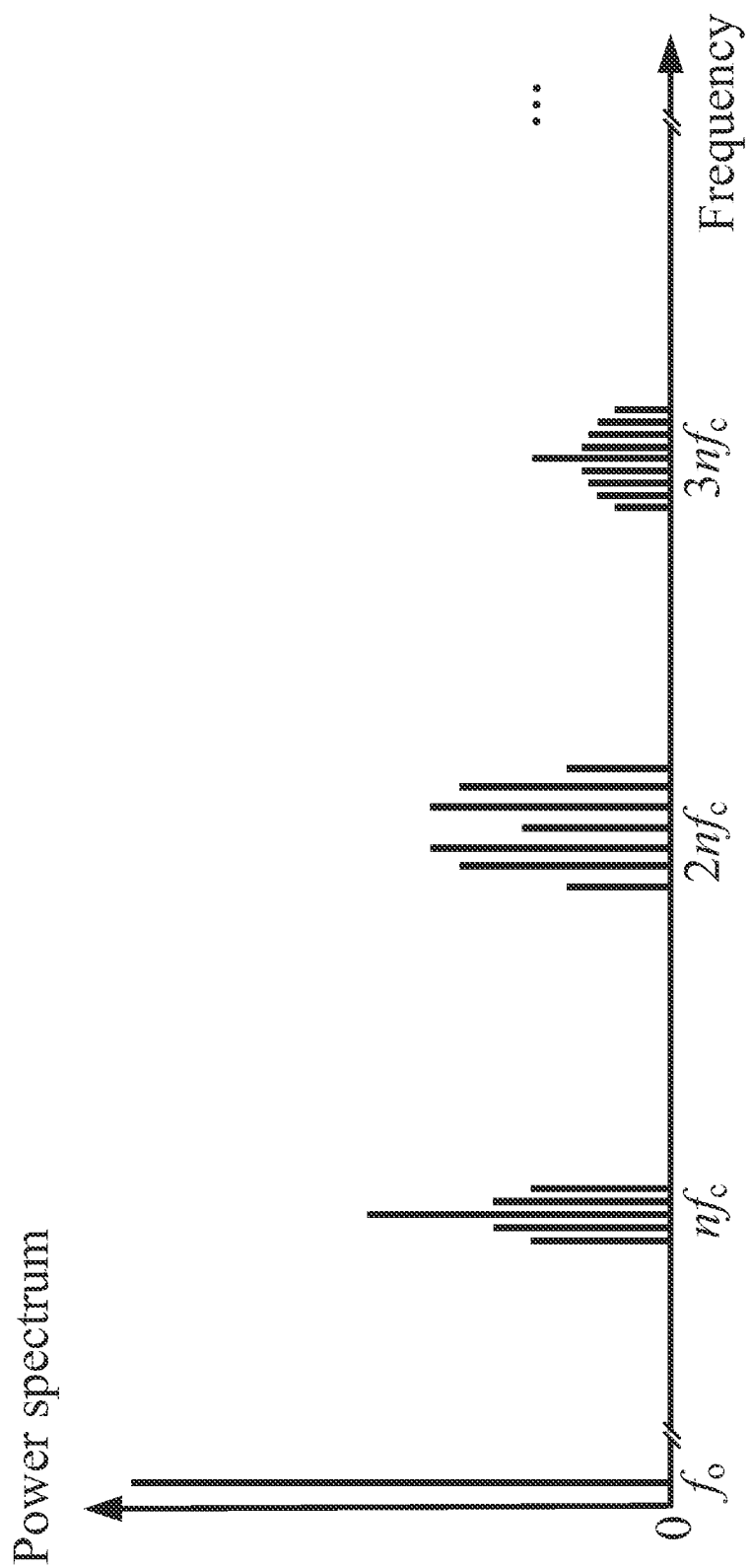
FIG. 7 is a harmonic frequency domain distribution diagram of output voltages of the carrier phase-shifting pulse width modulation.

According to formula (7), in the carrier wave phase-shifting pulse width modulation, when the number of carrier waves is not an integer multiple of n, there is no harmonic spectral lines of the output voltages at this frequency point and its sidebands; but when the number of carrier waves is an integer multiple of n, which is equivalent to the original two-level carrier frequency being increased by n times, at this time, the output voltage harmonic waves will be centered on the equivalent carrier frequency and its doubled frequency and symmetrically distributed, and center points of the harmonic spectral lines after multiple carrier waves are phase shifted will appear. For the carrier wave phase-shifting pulse width modulation with a carrier frequency of $f_o$ and n two-level H-bridges cascaded, the schematic diagram of the frequency domain distribution of voltage harmonic waves is shown in FIG. 7.

The carrier wave phase-shifting pulse width modulation technology can equivalently increase carrier frequencies, which is equivalent to shifting the harmonic spectral lines to a higher frequency band, but obvious harmonic peaks still exist, which is similar to the harmonic frequency domain distribution of the ordinary fixed carrier wave pulse width modulation.

Multi-Frequency Uniformization Carrier Wave Slope Random Distribution Pulse Width Modulation Technology On the basis of the carrier wave slope random distribution pulse width modulation technology, if the random carrier wave sequence is phase-shifted, the output voltage of the multi-frequency uniformization carrier wave slope random distribution pulse width modulation can be obtained from formula (7):

$$U_o(t)_{(k)} = \quad (8)$$
$$U\{m\sin(\omega_s t + \theta_s) + \frac{4n}{\pi}\sum_{i=1}^{\infty}\sum_{a=1}^{\infty}\sum_{b=-\infty}^{\infty}\frac{1}{kn}\sin(kn+b)\frac{\pi}{2}J_b\left(kn\frac{\pi}{2}M\right)$$
$$\sin[kn(\omega_i t + \theta_c) + b(\omega_s t + \theta_s)]\}$$

The second term in formula (8) is the harmonic part. Like the analysis of formula (7), after the carrier wave are phase shifted, it is equivalent to increasing the frequency of each random carrier wave by n times, that is to say, the equivalent angular frequency is $n\omega_i$, the equivalent average angular frequency is $nf_{av}$; it can be seen from formula (4) that the bandwidth corresponding to the various-times average carrier waves will also increase by $n^3$ times.

Figure 8:
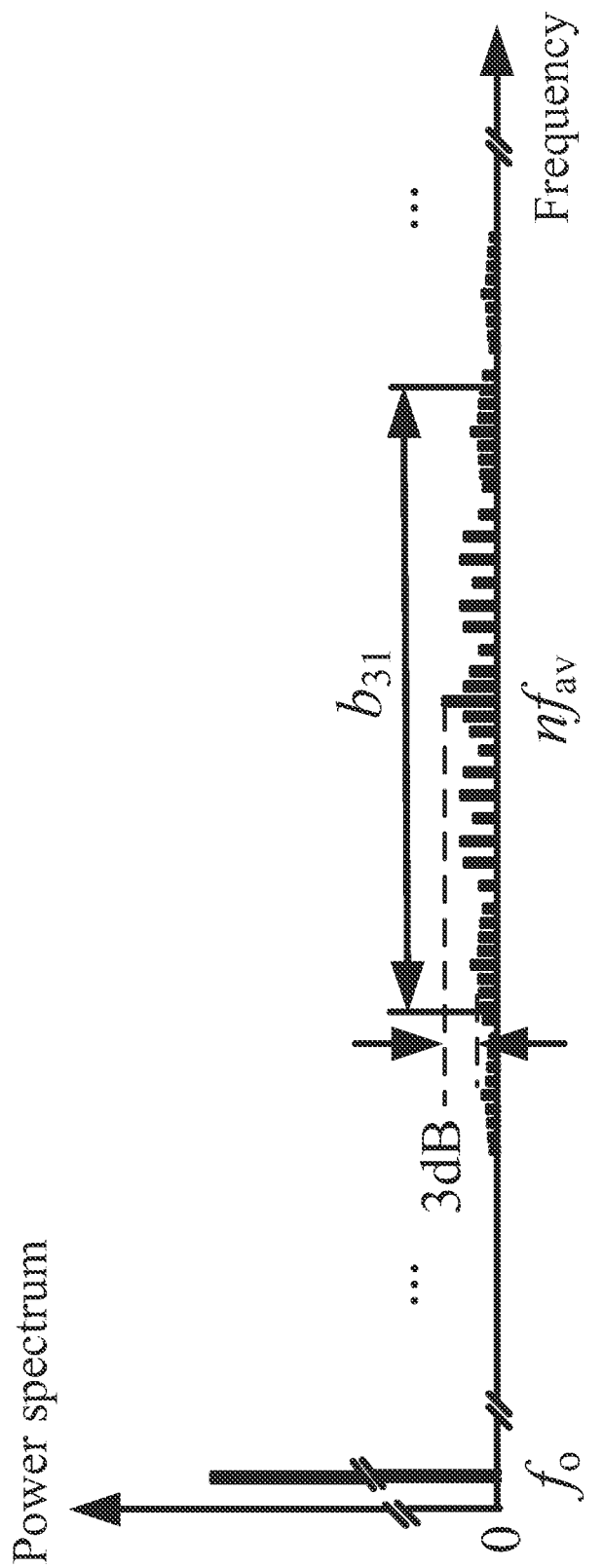
FIG. 8 is a harmonic power spectrum diagram of multi-frequency uniformization carrier phase-shifting pulse width modulation.

As shown in FIG. 8, compared to the carrier wave phase-shifting pulse width modulation technology, the harmonic spectral lines of the multi-frequency uniformization carrier wave slope random distribution pulse width modulation technology at $nf_{av}$ will randomly and uniformly distributed; compared to the carrier wave slope random distribution pulse width modulation technology, the 3 dB bandwidth of the power spectrum of the output voltage harmonic waves of the multi-frequency uniformization carrier wave slope random distribution pulse width modulation will be $n^3$ times that of the ordinary carrier wave slope random distribution pulse width modulation, and due to the frequency point with the highest harmonic peak is equivalently shifted to $nf_{av}$, the harmonic waves will have a wider range for expansion, and the probability statistical parameters of the random carrier wave sequence will have a wider selection range, which can make the output voltage harmonic waves distributed in a wider frequency domain, and reduce the prominent peak near one time the carrier frequency as much as possible, and enables the harmonics waves close to white noise in the entire frequency domain.

In order to illustrate the effectiveness of harmonics dispersion in the multi-frequency uniformization carrier slope random distribution pulse width modulation method, a simulation for the multi-frequency uniformization carrier slope random distribution pulse width modulation is carried out according to the above-mentioned method, and carrier wave phase-shifting pulse width modulation with a fixed carrier frequency is carried out at the same time.

The simulation conditions are set out as follows: a DC voltage source of the inverter module is set to 450 V, the frequency of the modulating wave is set to 217 Hz, and the frequency of the carrier wave is set to 2.5 kHz during fixed carrier wave phase-shifting pulse width modulation, a uniformly distributed random carrier wave sequence is selected when performing the multi-frequency uniformization carrier wave slope random distribution pulse width modulation, the average frequency of the random carrier wave sequence is set to 2.5 kHz, and each phase of the inverter topology selects double H-bridges cascaded, that is, four fixed triangular carrier waves with different phases are used to be compared respectively with the modulating wave to generate four sets of relatively independent pulse width modulation signals to drive two sets of power units. Each power unit is an H-bridge inverter circuit and is connected in series. The output of each power unit is superimposed to obtain a five-level output phase voltage. When preforming simulation of the fixed carrier wave phase-shifting pulse width modulation, single-phase output phase voltages, line voltages and their corresponding FFT analysis are obtained as shown in FIGS. 9A and 9B respectively.

Figure 10A:
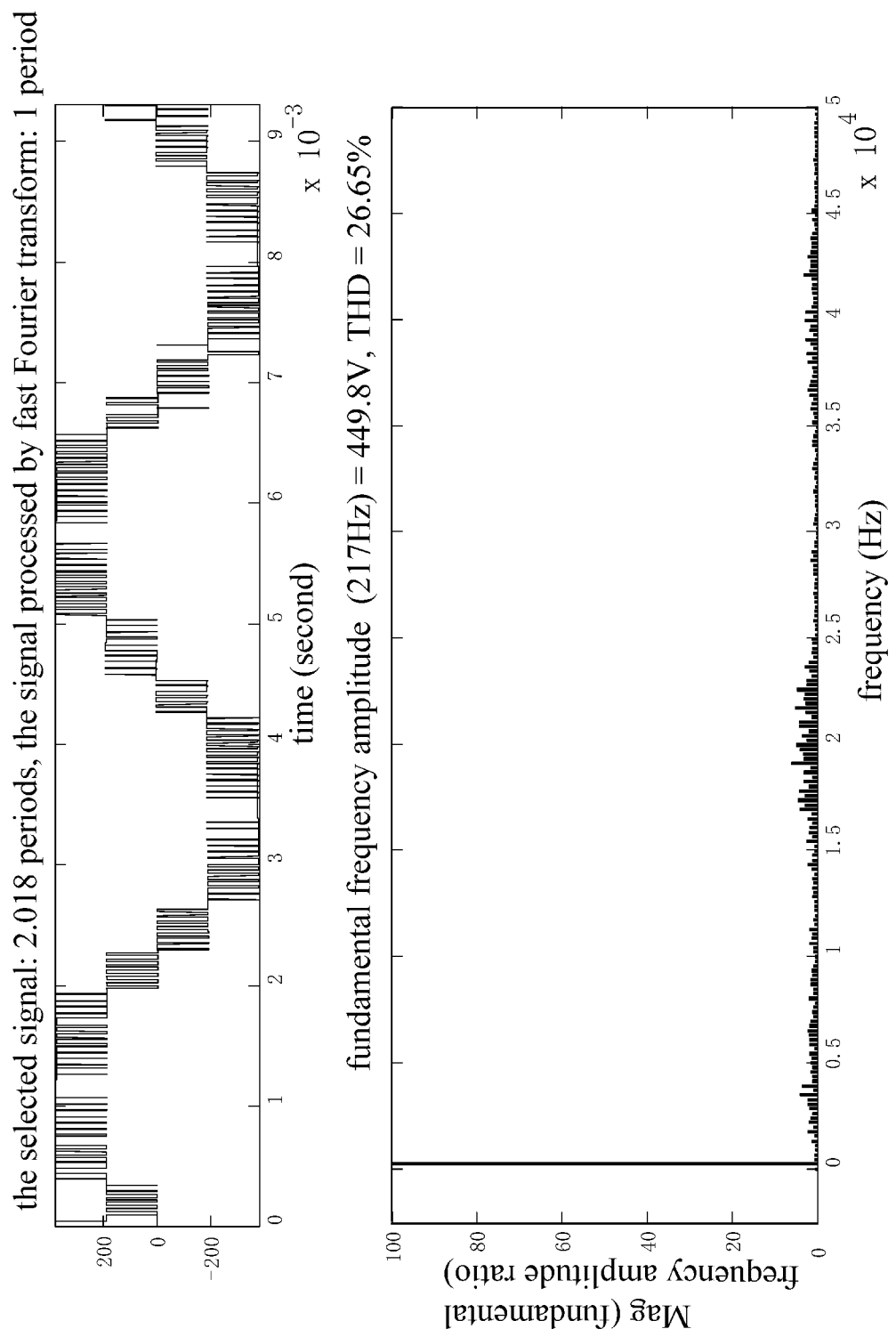
FIGS. 10A and 10B are schematic diagrams of phase voltages and line voltages and their corresponding FFT analyses of the multi-frequency uniformization carrier wave slope random distribution pulse width modulation.
Figure 10B:
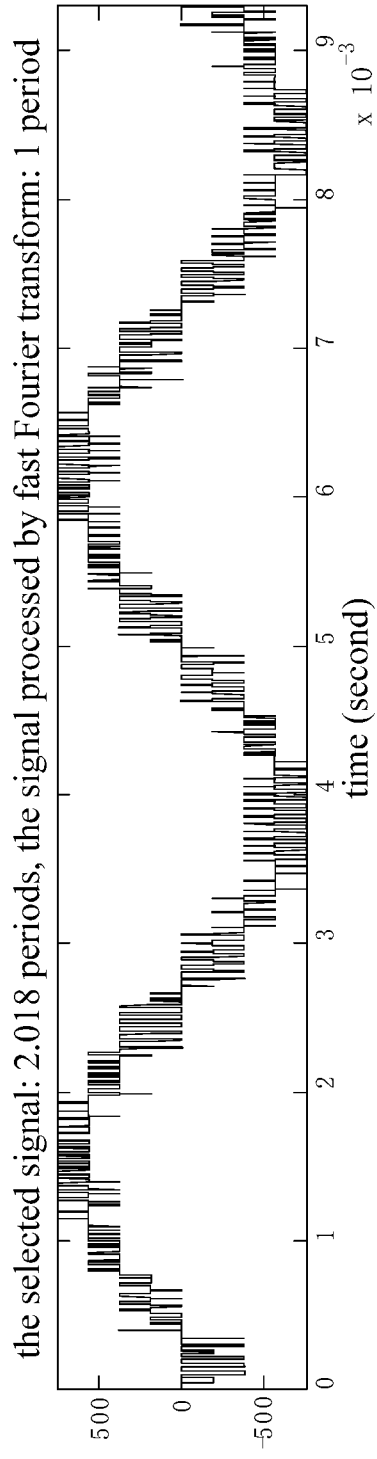
Figure 10B:
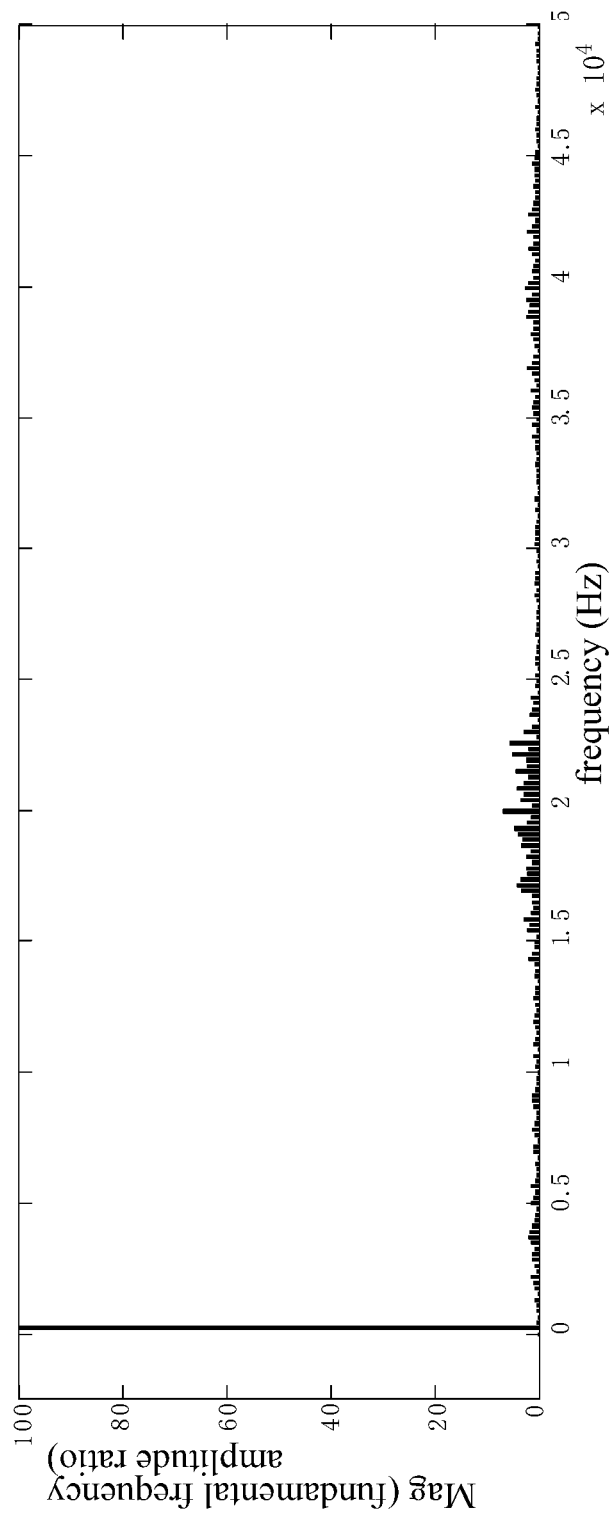

Under the same conditions, output phase voltages, line voltages and their corresponding FFT analyses of multi-frequency uniformization carrier wave slop random distribution pulse width modulation are obtained as shown in FIGS. 10 (a) and 10 (b) respectively.

Figure 9A:
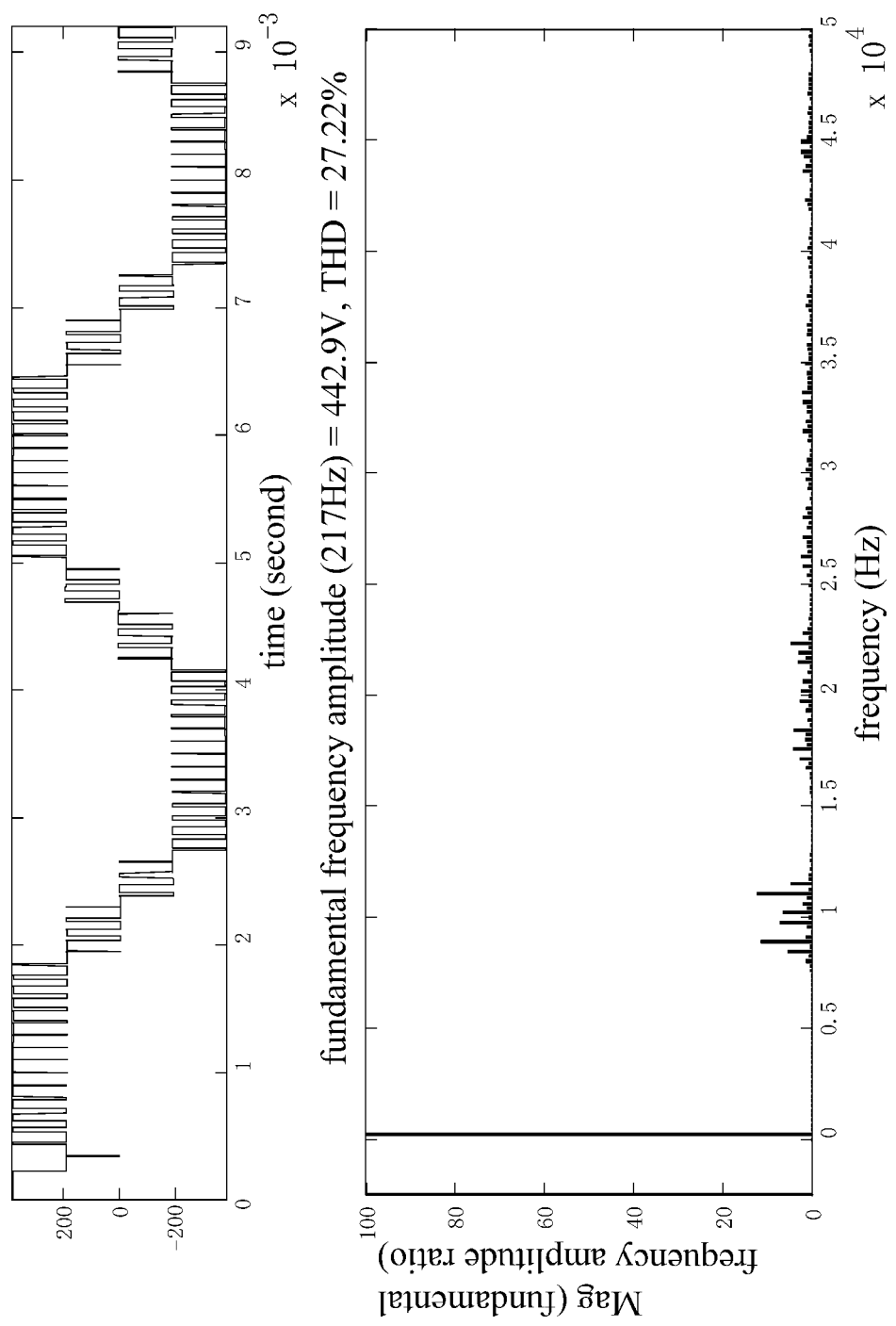
FIGS. 9A and 9B are schematic diagrams of phase voltages and line voltages and their corresponding FFT analyses of fixed carrier phase-shifting pulse width modulation.
Figure 9B:
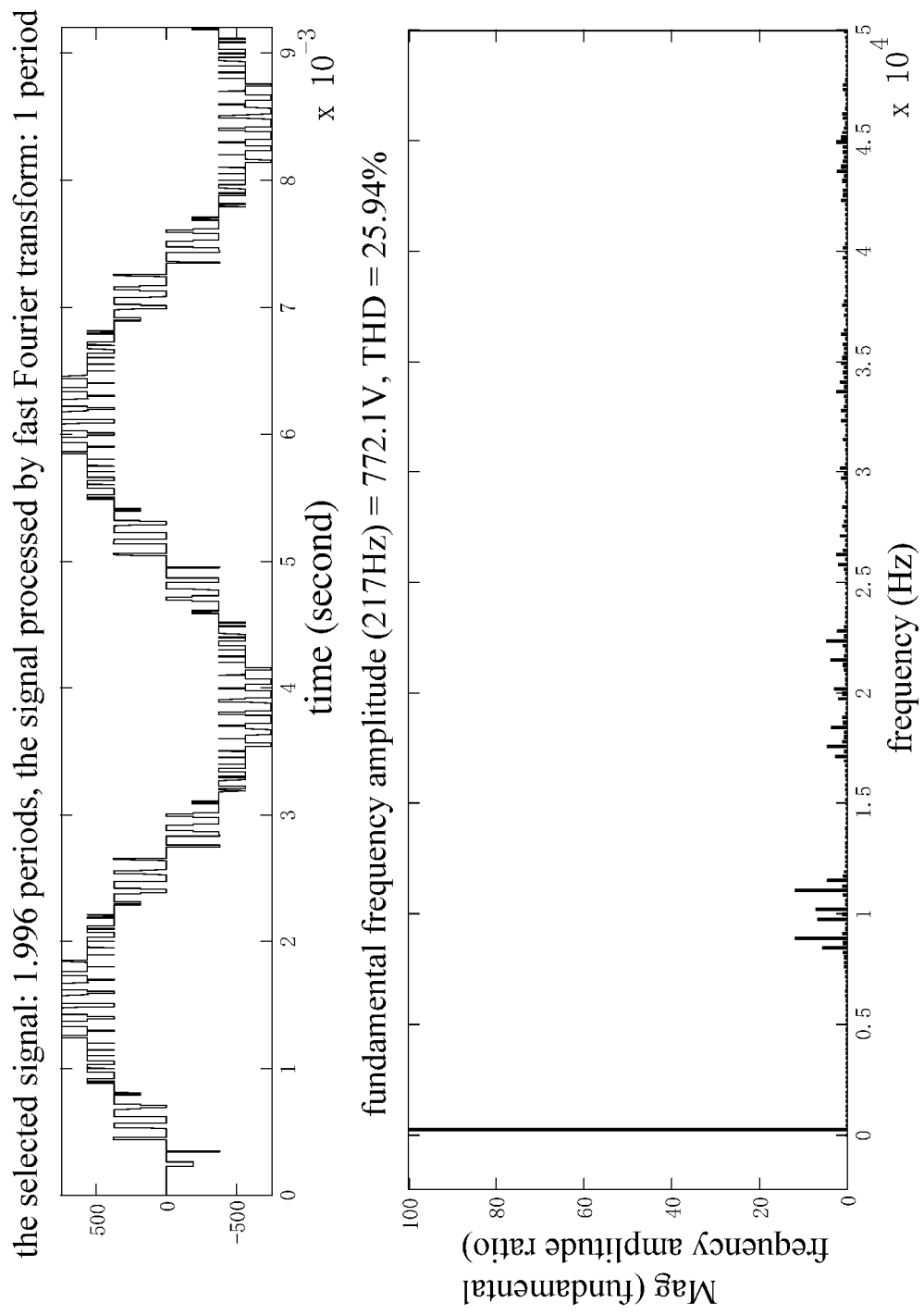

It can be seen from FIGS. 9A and 9B and FIGS. 10 A and 10B that the fundamental frequency amplitude of the two modulation methods at 217 Hz is close to 780 V, which is consistent with the theoretical value. Prominent peaks exists in the harmonic waves of the output phase voltages and line voltages of the fixed carrier wave phase-shifting pulse width modulation near a quadruple frequency of the carrier waves of 10 kHz, and the maximum is 13.60% of the fundamental wave amplitude, there are also obvious harmonic peaks near a frequency of 20 kHz and other doubled frequencies; however, there are no obvious harmonic peaks in the harmonic waves of the output phase voltages and line voltages of the multi-frequency uniformization carrier wave slop random distribution pulse width modulation in the observed frequency domain, and the harmonic spectral lines are uniformly distributed in a wider frequency domain.

Set the experimental conditions to be the same as the simulation, and we can obtain line voltage waveforms and their responding FFT analyses of the fixed/random carrier wave phase-shifting pulse width modulation as shown in FIGS. 11 (a) and 11 (b).

Figures 11A, 11B:
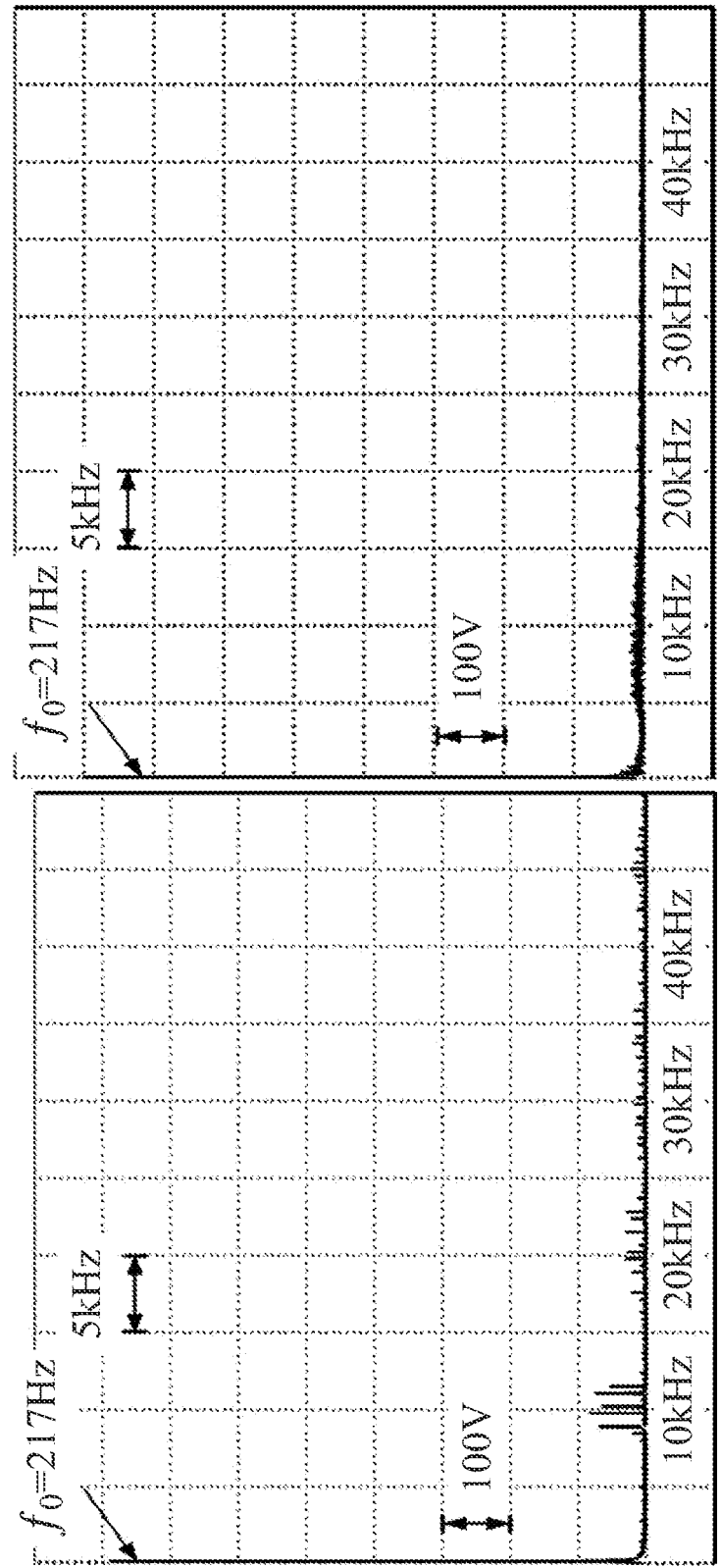
FIGS. 11A-11B are schematic diagrams of output line voltages and its corresponding FFT analyses of the fixed carrier phase-shifting pulse width modulation and the multi-frequency uniformization carrier wave slope random distribution pulse width modulation during the experiment.

The experimental waveforms shown in FIGS. 11A and 11B are similar to the simulated waveforms. It can be clearly observed that the line voltage spectrum map shown in FIG. 11A has multiple obvious harmonic peaks near a frequency of 10 kHz, and also has obvious harmonic spectral lines near a frequency of 20 kHz and other doubled frequencies, the maximum single harmonic peak reaches 13.06% of the fundamental wave amplitude; the line voltage spectrum shown in FIG. 11B is uniformly distributed in the observed frequency domain, and there is no obvious harmonic peak, only the harmonic spectral lines near a frequency of 10 kHz is denser, and the maximum harmonic peak has dropped to about 5% of the fundamental frequency amplitude.

The multi-frequency uniformization carrier wave slope random distribution pulse width modulation technology not only has the advantages of both the carrier wave phase-shifting and random pulse width modulation, but also has the following advantages when applied:

1) When the variance and average carrier frequency of the random carrier wave sequence are the same, the equivalent bandwidth of the output voltage power spectrum of the multi-frequency uniformization carrier wave slope random distribution pulse width modulation is $n^3$ times that of the ordinary carrier wave slope random distribution pulse width modulation;

2) A larger power spectrum bandwidth can be obtained by changing the average carrier frequency. The variance of the random carrier wave sequence correlates closely with the variation range of the random carrier waves. In actual practice, the frequency range of the switch device is usually limited, which restricts the value of the variance of the random carrier wave sequence, at this time, a large harmonic power spectrum bandwidth can be obtained by increasing the equivalent average carrier frequency.

3) Increasing the variance of the random carrier wave sequence and/or the average carrier frequency of the random carrier wave sequence can increase the 3 dB power spectrum bandwidth of the output voltage harmonic waves, but increasing the average carrier frequency of the random carrier wave sequence can shift the maximum single harmonic peak to a higher frequency point. Therefore, in multi-frequency uniformization carrier wave slope random distribution pulse width modulation, changing the average carrier frequency of the random carrier wave sequence has more benefits than changing the variance of the random carrier wave sequence.

It will be obvious to those skilled in the art that changes and modifications may be made, and therefore, the aim in the appended claims is to cover all such changes and modifications.

What is claimed is:

1. A multi-frequency uniformization carrier wave slope random distribution pulse width modulation method, wherein the method is used to make equivalent bandwidths of harmonic waves centered on various-times carrier frequencies and symmetrically distributed increase to enlarge a range of uniform distribution of the harmonic waves in a frequency domain, the method comprising:
   (1) selecting a required random carrier wave sequence and a modulating wave, and after the two are compared, generating a switch device drive signal for pulse width modulation;
   (2) determining a multiple n of an equivalent carrier frequency f of the random carrier wave sequence, and selecting a matched main circuit topology for carrier wave phase-shifting pulse width modulation; and
   (3) inputting the switch device drive signal generated in (1) into the main circuit topology of (2) to perform multi-frequency uniformization carrier wave slope random distribution pulse width modulation;
   wherein a probability statistical parameter of the random carrier wave sequence is set in advance, and an average carrier frequency of the random carrier wave sequence is $f_{av}$, a variance of a corresponding random carrier period is $T_0^2$, and a repetition time of the random carrier wave sequence is T, so as to control a frequency domain distribution of output voltage harmonic waves; and
   the average carrier frequency $f_{av}$ of the random carrier wave sequence is equal to a frequency of the modulating wave.

2. The method of claim 1, wherein the multiple n of the equivalent carrier frequency f is equal to 6, and the main circuit topology comprises an inverter module with three H-bridges cascaded.

3. A multi-frequency uniformization carrier wave slope random distribution pulse width modulation method, wherein the method is used to make equivalent bandwidths of harmonic waves centered on various-times carrier frequencies and symmetrically distributed increase to enlarge a range of uniform distribution of the harmonic waves in a frequency domain, the method comprising:
   (1) selecting a required random carrier wave sequence and a modulating wave, and after the two are compared, generating a switch device drive signal for pulse width modulation;
   (2) determining a multiple n of an equivalent carrier frequency f of the random carrier wave sequence, and selecting a matched main circuit topology for carrier wave phase-shifting pulse width modulation; and
   (3) inputting the switch device drive signal generated in (1) into the main circuit topology of (2) to perform multi-frequency uniformization carrier wave slope random distribution pulse width modulation;

wherein the multiple n of the equivalent carrier frequency f is equal to 4, and the main circuit topology comprises an inverter module with double H-bridges cascaded.

4. The method of claim 3, wherein a probability statistical parameter of the random carrier wave sequence is set in advance, and an average carrier frequency of the random carrier wave sequence is $f_{av}$, a variance of a corresponding random carrier period is $T_O^2$, and a repetition time of the random carrier wave sequence is T, so as to control a frequency domain distribution of output voltage harmonic waves.

5. The method of claim 4, wherein the average carrier frequency $f_{av}$ of the random carrier wave sequence is equal to a frequency of the modulating wave.

* * * * *